United States Patent [19]

Yano et al.

[11] Patent Number: 5,075,891
[45] Date of Patent: Dec. 24, 1991

[54] MEMORY WITH A VARIABLE IMPEDANCE BIT LINE LOAD CIRCUIT

[75] Inventors: Masatoshi Yano; Hideki Usuki; Shumpei Kohri; Hiroshi Ishida, all of Kanagawa, Japan

[73] Assignee: Sony Corporation, Tokyo, Japan

[21] Appl. No.: 276,683

[22] Filed: Nov. 28, 1988

[30] Foreign Application Priority Data

Nov. 27, 1987 [JP] Japan .................................. 62-299084
Nov. 28, 1987 [JP] Japan .................................. 62-301365

[51] Int. Cl.$^5$ .............................................. G11C 11/403
[52] U.S. Cl. ................................ 365/190; 365/189.09; 365/203
[58] Field of Search ................ 365/203, 190, 189.09, 365/227, 181

[56] References Cited

U.S. PATENT DOCUMENTS

| | | | |
|---|---|---|---|
| 4,386,419 | 5/1983 | Yamamoto | 365/190 |
| 4,636,983 | 1/1987 | Young et al. | 365/190 |
| 4,730,276 | 3/1988 | Waller | 365/189.09 |
| 4,791,613 | 12/1988 | Hardee | 365/189.09 |

FOREIGN PATENT DOCUMENTS

| | | |
|---|---|---|
| 0196586 | 10/1986 | European Pat. Off. |
| 0237813 | 9/1987 | European Pat. Off. |
| 0027489 | 2/1982 | Japan .................................. 365/190 |
| 0200595 | 9/1987 | Japan .................................. 365/203 |

Primary Examiner—Glenn Gossage
Attorney, Agent, or Firm—Philip M. Shaw, Jr.

[57] ABSTRACT

A static random access memory (SRAM) includes a pair of p-channel metal-oxide-semiconductor (PMOS) transistors which serve as variable resistors for terminating bit lines and a control circuit for causing the PMOS transistors to have a low impedance level during read out and an intermediate impedance level during writing so that sudden d.c. current is suppressed and the voltage at the bit lines is prevented from being lowered. The variable resistor device can constitute a current mirror circuit along with a metal-insulator-semiconductor (MIS) transistor of the control circuit, so that it becomes possible to provide a stable control which is invulnerable to manufacturing tolerances.

3 Claims, 3 Drawing Sheets

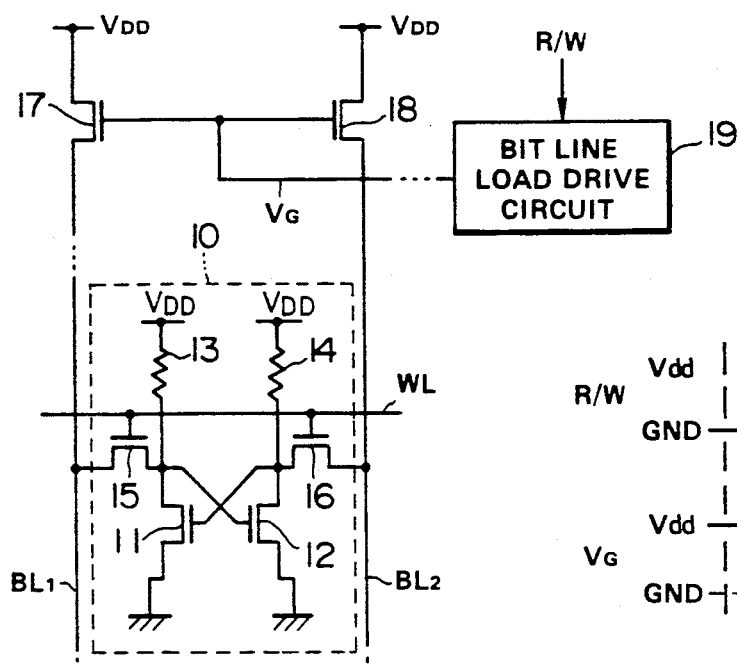
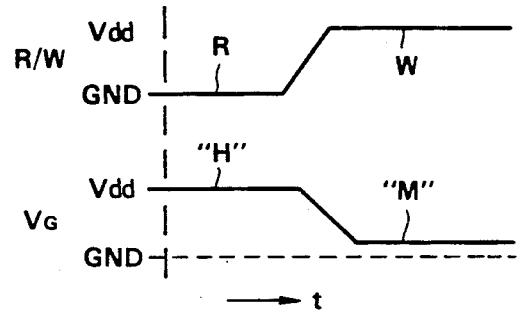
(PRIOR ART)
FIG. 1
(PRIOR ART)
FIG. 2
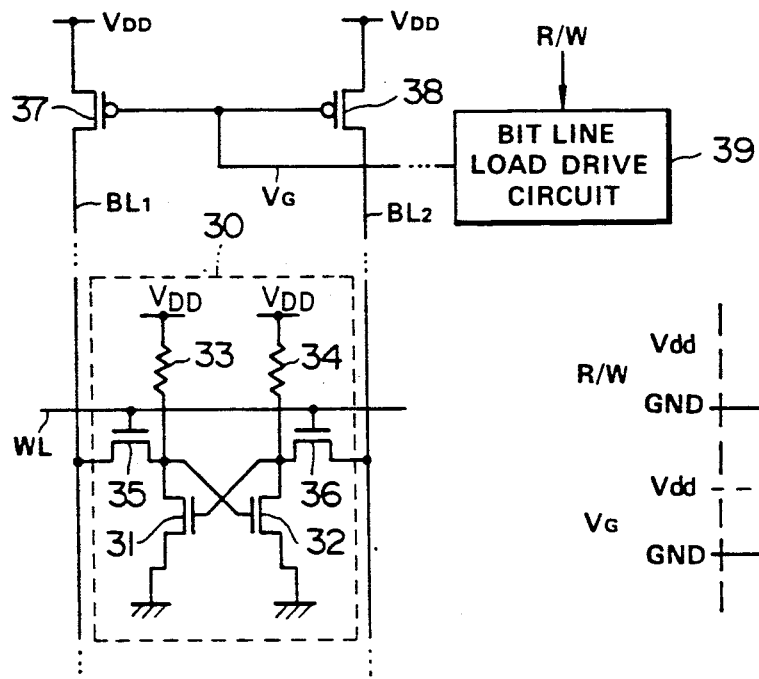
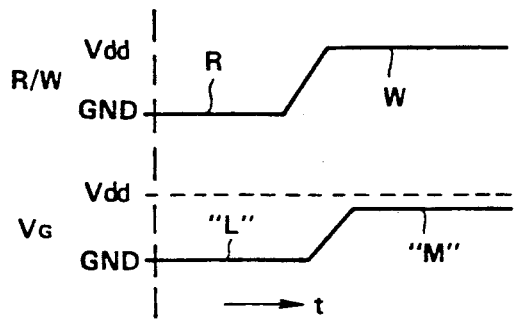
FIG. 3
FIG. 4

MEMORY WITH A VARIABLE IMPEDANCE BIT LINE LOAD CIRCUIT

FIELD OF THE INVENTION

This invention relates to a memory, such as a static RAM (SRAM), and, more particularly, to a memory including variable impedance bit-line loads.

DESCRIPTION OF THE PRIOR ART

There is a known type of memory, such as a static RAM, in which the load impedance of the bit line is rendered variable for reducing the d.c. current during the writing time. Such a memory is disclosed, for example, in the Japanese Patent Publication KOKOKU No. JP(B2) 60-44747.

It will be noted that, when the load impedance is simply rendered variable, sudden impedance fluctuations may be occasionally produced at the time of switching from the writing to the read-out cycles or vice versa. This problem can be eliminated by, for example, a prior-art technique disclosed in the Japanese Patent Application JP(A) 62-200595.

FIG. 1 shows the essential parts of a typical memory having such variable impedance bit-line loads according to the above prior art memory. A memory cell 10 of the memory includes a pair of cross-coupled NMOS (N type metal-oxide-semiconductor) transistors 11 and 12 and a pair of load resistors 13 and 14, which form a flip flop, and access transistors 15 and 16 selected by means of the word line WL. It is to be understood that the memory cell 10 which is shown is one of a plurality of such memory cells 10 which are provided between a pair of bit lines $BL_1$ and $BL_2$. At the terminal ends of the bit lines $BL_1$ and $BL_2$, NMOS transistors 17 and 18 are provided which function as variable resistors. The gate electrodes of these NMOS transistors 17 and 18 are connected to a bit line load drive circuit 19.

FIG. 2 shows the waveform of the read/write control signals R/W fed to the bit line load drive circuit 19 (upper waveform) and the gate voltage $V_G$ fed to the gate electrodes of the NMOS transistors 17 and 18 (lower waveform) During read out, the gate voltage $V_G$ is brought to a high (H) level, causing the bit lines $BL_1$ and $BL_2$ to be pulled up to the source voltage $V_{DD}$. During writing, the gate voltage $V_G$ is brought to a mid level, (M) intermediate the high (H) level and a low (L) level near ground, so that it becomes possible to suppress the so-called rush current caused by rapid changes in impedance at the time of switching from the write to the read out cycles. Such a rush of current may occur if the gate voltage were suddenly switched from the high (H) level to the low (L) level.

However, the MOS transistors making up the variable resistors in the above described prior-art technique are NMOS transistors and are therefore likely to lower the bit line potential.

That is, during writing, the gate voltage $V_G$ fed to the gate electrodes of the NMOS transistors is dropped to the M level, in order to bring the NMOS transistors 17 and 18 to the state of high impedance. This sets the potential of the bit lines $BL_1$ and $BL_2$ connected to the source sides of the NMOS transistors 17 and 18 to a value equal to the M level voltage less the transistor gate-to-source voltage. The gate-to-source voltage is equal to the threshold voltage (Vth+ΔVth). The value Vth is the nominal threshold voltage and the term ΔVth represents variations in the threshold voltage due to temperature and due to manufacturing tolerances. With the potential of the bit lines $BL_1$ and $BL_2$ thus lowered significantly, there is a risk of data destruction of the selected memory cell.

Also, as a result of manufacturing tolerances of the NMOS transistors making up the variable resistors, variations in the d.c. operating current flowing in the MOS transistors may occur. This is the current flowing from the variable resistor into the memory cell. The fluctuations in the d.c. operating current is further increased due to the fluctuations in the characteristics of the elements making up the load drive circuit 19 of the bit lines controlling the variable resistors.

SUMMARY OF THE INVENTION

The present invention provides a memory including a variable impedance bit line load circuit wherein the variable resistors are formed by PMOS (P type metal-oxide-semiconductor) transistors, these PMOS transistors being controlled to have a low impedance level during read-out and a middle impedance level during writing so as to suppress a so-called rush current as well as to prevent a voltage drop from occurring on the bit lines.

The present invention also provides a memory including a variable impedance bit line load circuit in which MIS (metal-insulating-semiconductor) transistors of the variable resistors and the control circuits make up current mirror circuits which are stable and insensitive to manufacturing tolerances.

BRIEF DESCRIPTION OF THE DRAWINGS

In the accompanying drawings,

FIG. 1 is a circuit diagram showing the essential parts of the prior art memory disclosed in the Japanese Patent Application JP(A) 62-200595;

FIG. 2 a waveform diagram showing the operation of the prior-art memory shown in FIG. 1;

FIG. 3 is a circuit diagram showing the essential parts of a memory according to a first embodiment of the present invention;

FIG. 4 is a waveform diagram showing the operation of the first embodiment illustrated in FIG. 3;

DESCRIPTION OF THE PREFERRED EMBODIMENT

Figure 5:
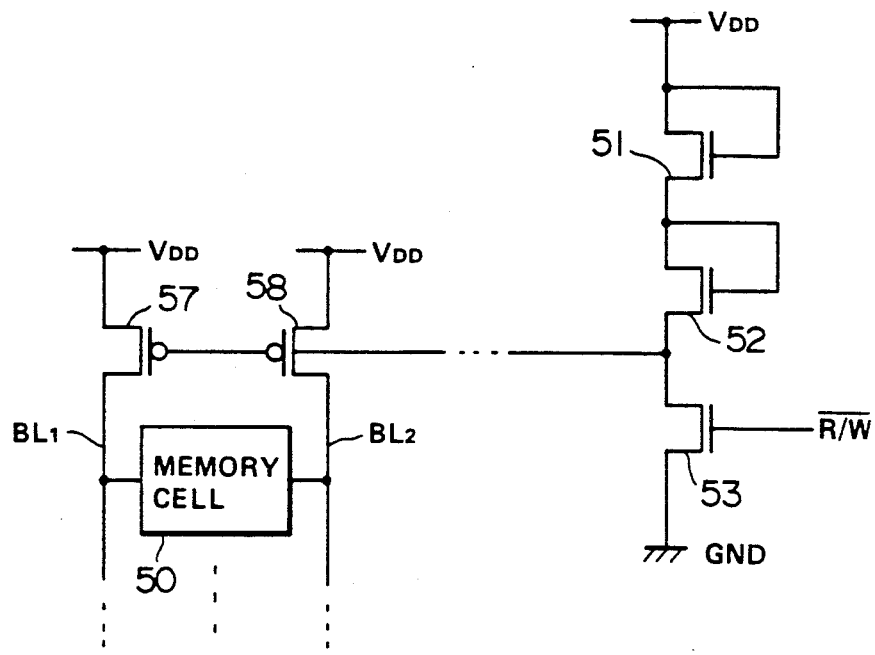
FIG. 5 is a circuit diagram showing an example of a bit line load drive circuit in the first embodiment illustrated in FIG. 3.

Referring to the accompanying drawings, certain preferred embodiments of the present invention will be explained in detail.

First Embodiment

FIG. 3 shows a circuit for the essential portions of a memory according to a first embodiment of the present invention.

The numeral 30 denotes a memory cell of the memory. The memory cell 30 includes a pair of NMOS transistors 31 and 32 having cross-coupled drain to gate connections and a pair of high resistance resistors 33 and 34 which function as load resistors connected to the drain electrodes of the transistors. The other terminals of resistors 33 and 34 are connected to a suitable biasing source. The memory cell 30 also includes access transistors 35 and 36 which are connected to the drain electrodes of the NMOS transistors 31, 32 respectively, and are selected by means of a word line WL. The drain of NMOS transistor 31 is connected to a bit line $BL_1$ through the NMOS transistor 35, while the drain of NMOS transistor 32 is connected to a bit line $BL_2$ through the NMOS transistor 36. While other memory cells are not shown, it is to be understood that the memory cell 30 is one of a number of such memory cells connected together to form a matrix, such that a plurality of memory cells 30 are provided between a first pair of adjacent bit lines $BL_1$ and $BL_2$ in the longitudinal direction. Another set of longitudinally arranged memory cells are provided between another pair of bit lines located adjacent to the first pair of bit lines.

At the terminal ends of bit lines $BL_1$ and $BL_2$ associated with these memory cells 30 are PMOS transistor 37 and 38, respectively. The PMOS transistors 37 and 38 serve as the variable resistors. The source sides of the PMOS transistors 37 and 38 are each connected to a source voltage $V_{DD}$ while drain sides of the PMOS transistors 37 and 38 are connected to the bit lines $BL_1$ and $BL_2$. The gate electrodes of PMOS transistors 37 and 38 are connected to a bit line load drive circuit 39. The same applies for the other columns of the matrix (not shown), such that the gate electrodes of the PMOS transistors are connected in common to the bit line load drive circuit 39.

A read/write signal R/W is input to the bit line load drive circuit 39, which outputs a signal switchable between a low (L) level and a mid level (M). The levels produced depend upon the level of the R/W signal received. The bit line load drive circuit 39 may utilize, for example, a diode drop for realizing the middle or intermediate (M) level.

Referring now to FIG. 4, the operation of the memory of the present embodiment will be explained.

During the read-out time, the read/write signal R/W is brought to the low (L) level, that is, to the ground (GND) level. The output signal of the bit-line load drive circuit 39 is then brought to the low (L) level, and it is applied as the PMOS transistors 37 and 38 gate voltage $V_G$, so that the PMOS transistors 37 and 38 (as the variable resistors) are brought to the low impedance state. With the PMOS transistors 37 and 38 in the low impedance state, the potential at the bit lines $BL_1$ and $BL_2$, is raised and sense amplifiers (not shown) connected to these bit lines $BL_1$ and $BL_2$ are able to sense the state of memory cell 30. The current flowing, during this time, through the PMOS transistors 37 and 38 is determined by the channel conductance of the drive transistors 31 and 32 of the memory cell 30 which determines the state of the cell.

During the write time, the read/write signal R/W is brought to a high (H) level. The output signal of the bit-line load drive circuit 39 is then set to a mid (M) level between the high level (or source voltage $V_{DD}$) and a low level. As a result, the gate voltage $V_G$ is at the M level, so that the PMOS transistors 37 and 38 are brought to an intermediate impedance state between the low and high impedance states. The currents flowing through PMOS transistors 37 and 38 are determined by the values of the channel conductances of transistors 37 and 38. The middle level of the gate voltage $V_G$ may be set to a level which increases the impedance of the PMOS transistors 37 and 38 for reducing the power consumption during the write time. On the other hand, when the above impedance is lowered, a so-called rush current at the transition time from writing to read-out may be reduced. Since the bit lines $BL_1$ and $BL_2$ are connected to the drain sides of the PMOS transistors 37 and 38, no problems will arise in the circuit operation or performance. That is, there is no voltage drop at the bit lines such as is caused with the use of the NMOS transistors as in the prior art memory discussed above. It is therefore possible to prevent destruction of the memory cell data caused by a voltage drop at the bit line.

FIG. 5 shows a first embodiment of the bit line load drive circuit 39 of the present invention. The gate voltage $V_G$ supplied to the gates of the PMOS transistors 37 and 38 is determined by the diode configured NMOS transistors 51 and 52 which are connected in series to the circuit ground through an NMOS transistor 53. The read/write (R/W) signal is applied to the gate of the NMOS transistor 53 for turning it on or off in a controlled manner.

Second Embodiment

Figure 6:
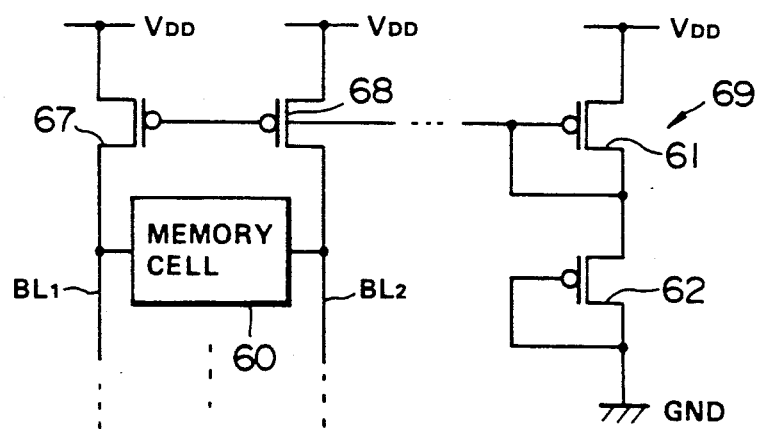
FIG. 6 is a circuit diagram showing the essential parts of a memory according to a second embodiment of the present invention.

The second embodiment is shown in FIG. 6. The memory cell 60 is constructed similar to memory cell 30. The memory cell 60 is also connected between the bit lines $BL_1$ and $BL_2$. As with the memory illustrated in FIG. 1, it is to be understood that although only one memory cell 60 is illustrated, a number of such memory cells 60 are connected together to form a matrix. A plurality of memory cells 60 are provided between a given pair of adjacent bit lines $BL_1$ and $BL_2$ in the longitudinal direction. Similarly, other memory cells 60 are also provided in the longitudinal direction between other pairs of bit lines.

The drain electrodes of PMOS transistors 67 and 68 are each connected to the terminal ends of bit lines $BL_1$ and $BL_2$, respectively, associated with memory cells 60. The source sides of the PMOS transistors 67 and 68 are each connected to a source voltage $V_{GG}$. The gate electrodes of the PMOS transistors 67 and 68 are connected to a control circuit 69. Although not shown, the other bit lines are similarly associated with PMOS transistors, as the variable resistor means, each PMOS transistor having its gate electrode connected to a control circuit 69.

The control circuit 69 is composed of a series circuit of a PMOS transistor 61 and a constant current source 62, which is also a PMOS transistor. The PMOS transistor 61 has its gate and drain electrodes connected in common and has its gate electrode connected to the gate electrodes of the PMOS transistors 67 and 68, so that a current mirror circuit is formed by the PMOS transistors 61, 67 and 68. The PMOS transistor 62 forming the constant current source 62 has its drain and gate electrodes connected to the ground (GND) level. The constant current source 62 is connected in series with the drain electrode of the PMOS transistor 61 for limiting the current flowing in the PMOS transistor 61.

The current flowing through the PMOS transistor 67 is designated $I_{67}$ (and is equal to the current flowing through transistor 68) and the current flowing through the PMOS transistor 61 is designated $I_{61}$. The current flowing from the source voltage $V_{DD}$ to the ground voltage GND in the control circuit 69 is controlled by the constant current source 62 such that the current $I_{61}$ (flowing through the PMOS transistor 61) has a magnitude which is determined by the constant current source 62. Since the PMOS transistor 67 constitutes a current mirror circuit with the PMOS transistor 61, the magnitude of the current $I_{67}$ is proportional to $I_{61}$. In particular, the proportion is determined by the ratio of the value of the channel conductance of the PMOS transistor 61 to the value of the channel conductance of the PMOS transistor 67. The result is that the d.c. operating current at the time of writing is determined by the current value of the PMOS transistor 61 of the current mirror circuit, which in turn is determined by the magnitude of the current of the constant current source 62. In this manner, the d.c. operating current during writing can be adjusted easily by controlling the value of the constant current of the constant current source 62 and thus the ratio of the values of channel conductance of the transistors 67 and 61 making up the current mirror circuit.

In the current mirror circuit arrangement, the gate size of the constant current source (transistor) 62 increases and results in a lowered rate of fluctuations in the parameters ascribable to manufacturing tolerances of the constant current source 62. Therefore, even when the PMOS transistors 67 and 68, serving as the variable resistor, are reduced in size, fluctuations in the current values of the PMOS transistors 67 and 68 can be suppressed by virtue of the above described relation of proportionality so that a stable circuit operation is assured.

The variable resistor transistors 67 and 68 and the transistor 61 are PMOS transistors and are produced by the same production process. Thus, the transistors 67, 68 and 61 gate sizes, such as the gate length or width, or the fluctuations in their threshold voltage Vth, during the course of the adjustment process, all exhibit the same tendencies. Therefore the memory is produced in such a manner that the d.c. operating current is insensitive to manufacturing tolerances.

Third Embodiment

The memory of this embodiment is a more concrete and practical version of the preceding, second embodiment.

Figure 7:
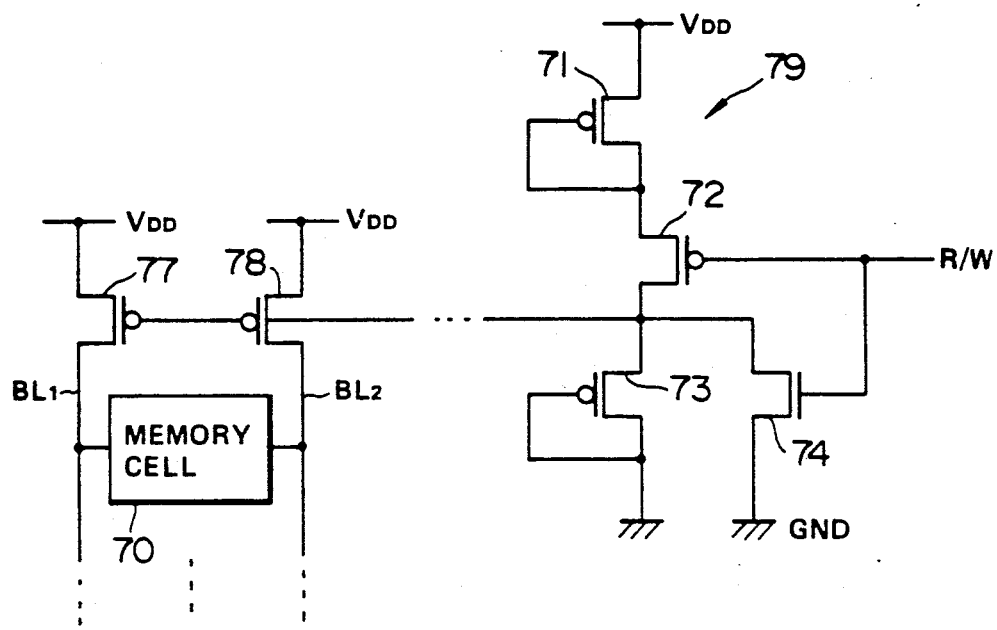
FIG. 7 a circuit diagram showing the essential parts of a memory according to a third embodiment of the present invention.

Referring to FIG. 7, the memory includes a memory cell 70 connected to a pair of bit lines $BL_1$ and $BL_2$. As with the memory cells 60 of the preceding second embodiment, a number of the memory cells 70 are connected in a matrix to form a memory cell array. PMOS transistors 77 and 78 which serve as the variable resistor means are connected to the terminal ends of bit line $BL_1$ and $BL_2$, respectively. A source voltage $V_{DD}$ is supplied to the source sides of the PMOS transistor 77 and 78, while the drain sides of the PMOS transistors 77 and 78 are connected to the bit lines $BL_1$ and $BL_2$.

A control circuit 79 includes PMOS transistors 71, 72 and 73 and an NMOS transistor 74. The PMOS transistors 71, 72, 73 are connected in series between the source voltage $V_{DD}$ and the ground voltage GND, and the NMOS transistor 74 is connected in parallel with the PMOS transistor 73 between the drain electrode of transistor 72 and the circuit ground GND.

The PMOS transistor 71 constitutes a current mirror circuit with the PMOS transistors 77 and 78. The PMOS transistors 77 and 78 have their gate electrodes connected in common, and their source electrodes connected to the source voltage $V_{DD}$. The PMOS transistor 71 has its drain and gate electrodes connected to the source electrode of the PMOS transistor 72.

The PMOS transistor 72 is a switching element, and its gate is supplied with the read/write signal R/W. The PMOS transistor 72 has its drain electrode connected to the gates of the PMOS transistors 77 and 78, the source electrode of the PMOS transistor 73, and the drain electrode of the NMOS transistor 74.

The PMOS transistor 73 acts as a constant current source. The ground voltage GND is supplied to both the gate and drain of the PMOS transistor 73. The read/write signal R/W is also supplied to the gate of the NMOS transistor 74. The NMOS transistor 74 has its source connected to the ground voltage GND.

The above described memory of the present embodiment operates in the following manner.

During the read-out time, the read/write signal R/W is set to a high (H) level so that the PMOS transistor 72 is turned off while the NMOS transistor 74 is turned on. The gate voltage of the PMOS transistors 77 and 78 is then about equal to the ground voltage GND such that the PMOS transistors 77 and 78 acting as the loads, are brought to a low impedance state.

During writing, the read/write signal R/W is set to the low (L) level so that the PMOS transistor 72 is turned on and the NMOS transistor 74 is turned off. The current then flows from the source voltage $V_{DD}$ to the ground voltage GND via the PMOS transistors 71 to 73. The current flow causes the PMOS transistors 77 and 78 to go to the high impedance state. At this time, the magnitude of the current flowing in the PMOS transistor 71 is determined by the PMOS transistor 73 acting as a constant current source. Similarly, the current flowing in the PMOS transistors 77 and 78 is determined by the PMOS transistor 71, since the PMOS transistors 77 and 78 and the PMOS transistor 71 make up the current mirror circuit. Therefore, the impedance values of the PMOS transistors 77 and 78 are dependent upon the constant current source formed by transistor 73 so that they are stabilized.

Also, as was the case with the preceding second embodiment, the d.c. operating current during writing is determined by the ratio of the value of the channel conductance of the PMOS transistor 73 to the values of the current conductance of the transistors 71, 77, 78 constituting the current mirror circuit. Hence the d.c. operating current can be adjusted easily.

Also, during writing, the PMOS transistors 77 and 78, as the variable resistors, can be brought to an intermediate state between the low and high impedance states.

Also, by increasing the size of the PMOS transistor 73 as compared to the other elements, the rate of fluctuations of the parameters caused by manufacturing tolerances can be lowered so that a stable circuit performance is assured.

In addition, the PMOS transistors 77 and 78 and the PMOS transistor 71 tend to be uniform in manufacturing tolerances, so that it becomes possible to suppress fluctuations in the d.c. operating current.

Fourth Embodiment

Figure 8:
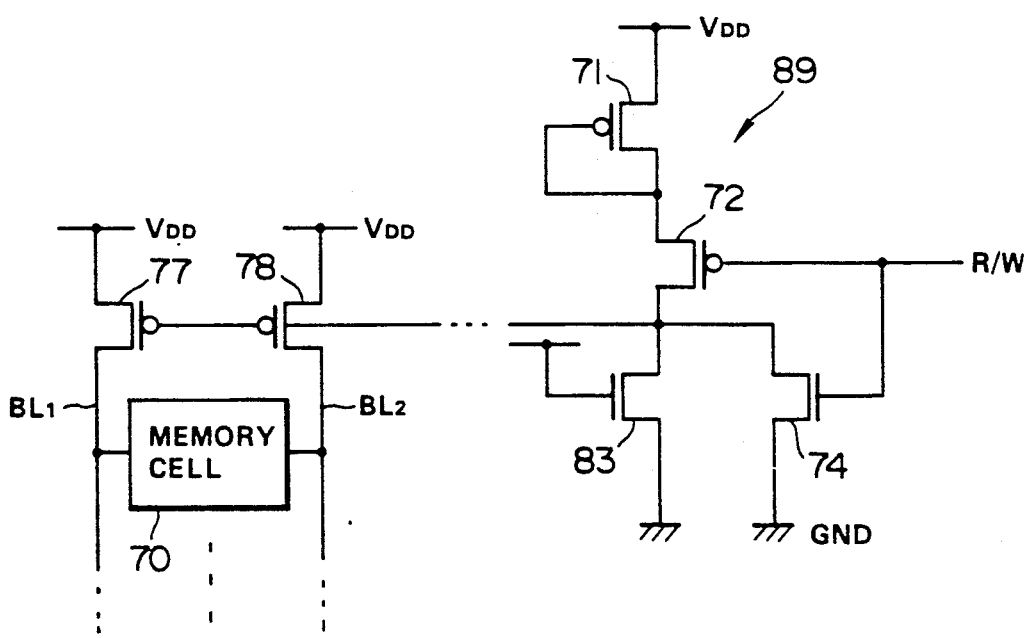
FIG. 8 is a circuit diagram showing the essential parts of a memory according to a fourth embodiment of the present invention.

The present fourth circuit embodiment, in which the NMOS transistor dependency is increased, is illustrated in FIG. 8.

The fourth circuit, illustrated in FIG. 8, is a modification of the previously described third embodiment illustrated in FIG. 9. Comparing the fourth circuit embodiment with the third circuit embodiment shown in FIG. 7, the fourth circuit embodiment substitutes the PMOS transistor 73 with an NMOS transistor 83; and the NMOS transistor is used as the constant current source. The remainder of the circuit elements are unchanged. Therefore, they are indicated by the same reference numerals as those used in FIG. 7 and the accompanying corresponding description is omitted here for simplicity.

Using an NMOS transistor 83, as the current source, allows the manufacturing tolerances of the NMOS transistor 83 to be reflected in the current values of the constant current source. In turn, by having the tolerances reflected in the current values results in the memory being insensitive not only to the manufacturing tolerances of the PMOS transistor but also to the manufacturing tolerances of the NMOS transistor as well.

In the memory of the present embodiment, control of the transistors 77 and 78 of the variable resistor means can be accomplished in a stable manner, similar to the memory of the previously described second and third embodiments, while the memory is also insensitive to manufacturing tolerances since the NMOS transistor 83 is increased in size.

It should be noted that the memory of the present invention is not limited to the above described first through fourth embodiments, but various modifications can be made thereto without departing from the purpose of the invention.

What is claimed is:

1. A memory comprising:
   a memory cell;
   first and second bit lines connected to said memory cell;
   first variable impedance means for providing a variable impedance between the first bit line and a source voltage supply in response to a control signal, said first variable impedance means including a first p-channel metal-insulating-semiconductor (MIS) transistor having a source electrode coupled to the source supply voltage supply, and a drain electrode coupled to the first bit line and a gate electrode coupled to an impedance control signal line;
   second variable impedance means for providing a variable impedance between the second bit line and the source voltage supply in response to the control signal, said second variable impedance means including a second p-channel (MIS) transistor having a source electrode coupled to the source voltage a drain electrode coupled to the second bit line and a gate electrode coupled to the impedance control signal line;
   control circuit means for producing the control signal in response to a memory read-write command signal, said control circuit means comprising
      a third p-channel MIS transistor having a source electrode coupled to the source voltage supply and gate and drain electrodes coupled together;
      a fourth p-channel MIS transistor having a source electrode coupled to the drain and gate electrodes of the third p-channel MIS transistor, a gate electrode which receives the memory read-write command signal and a drain electrode coupled to the impedance control signal line;
      an n-channel MIS transistor having a source electrode coupled to a circuit ground and gate and drain electrodes coupled to the gate and drain electrodes, respectively, of the fourth p-channel MIS transistor;
      constant current source means for producing a current and having a pair of electrodes coupled to the drain and source electrodes, respectively, of the n-channel MIS transistor; and
   wherein the control signal is produced on the impedance control signal line and wherein the read-write command signal causes the control circuit means to produce the control signal at a first predetermined potential which causes the first and second p-channel MIS transistors to switch to a first impedance at the time of writing data into the cell and to produce the control signal at a second predetermined potential which causes the first and second p-channel MIS transistors to switch to a second impedance, lower than the first impedance, at the time of reading data out of the cell.

2. The memory of claim 1 wherein the constant current source means includes a fifth p-channel MIS transistor having a source electrode coupled to the drain electrode of the fourth p-channel MIS transistor and gate and drain electrodes coupled to the circuit ground.

3. The memory of claim 1 wherein the current source means includes a second n-channel MIS transistor having a drain electrode coupled to the drain electrode of the fourth p-channel transistor, a gate electrode coupled to the source voltage supply and a source electrode coupled to the circuit ground.

* * * * *